(12) United States Patent
Chen et al.

(10) Patent No.: US 9,847,509 B2
(45) Date of Patent: Dec. 19, 2017

(54) PACKAGE OF FLEXIBLE ENVIRONMENTAL SENSITIVE ELECTRONIC DEVICE AND SEALING MEMBER

(71) Applicant: Industrial Technology Research Institute, Hsinchu (TW)

(72) Inventors: Kun-Ming Chen, Taoyuan (TW); Chen-Chu Tsai, Taichung (TW); Yuh-Zheng Lee, Hsinchu (TW); Kuo-Lung Lo, New Taipei (TW)

(73) Assignee: Industrial Technology Research Institute, Hsinchu (TW)

( * ) Notice: Subject to any disclaimer, the term of this patent is extended or adjusted under 35 U.S.C. 154(b) by 0 days.

(21) Appl. No.: 15/003,803

(22) Filed: Jan. 22, 2016

(65) Prior Publication Data
US 2016/0218320 A1    Jul. 28, 2016

Related U.S. Application Data

(60) Provisional application No. 62/106,234, filed on Jan. 22, 2015.

(30) Foreign Application Priority Data

May 15, 2015  (TW) .............. 104115559 A
Aug. 11, 2015  (CN) ............ 2015 1 0489470

(51) Int. Cl.
*H01L 51/52* (2006.01)

(52) U.S. Cl.
CPC ...... *H01L 51/5256* (2013.01); *H01L 51/5246* (2013.01); *H01L 2251/5338* (2013.01); *H01L 2251/558* (2013.01)

(58) Field of Classification Search
CPC ............. H01L 51/5256; H01L 51/5246; H01L 2251/5338; H01L 2251/301; H01L 2251/558; H01L 51/52
(Continued)

(56) References Cited

U.S. PATENT DOCUMENTS

| 5,855,994 | A | 1/1999 | Biebuyck et al. |
| 6,576,351 | B2 | 6/2003 | Silvernail |

(Continued)

FOREIGN PATENT DOCUMENTS

| CN | 1496198 | 5/2004 |
| CN | 1806348 | 7/2006 |

(Continued)

OTHER PUBLICATIONS

"Office Action of Taiwan Related Application No. 99130696," dated Apr. 14, 2014, p. 1-p. 15, in which the listed references (Ref. 1-4) were cited.
(Continued)

*Primary Examiner* — Alexander Oscar Williams
(74) *Attorney, Agent, or Firm* — JCIPRNET

(57) ABSTRACT

A flexible environmental sensitive electronic device package including a flexible electronic device, a thin film encapsulation (TFE) and a sealing member is provided. The TFE covers the flexible electronic device as well as the sealing member covers the TFE and the flexible electronic device. The sealing member includes a first portion and a second portion, wherein the first portion covers the flexible electronic device and the TFE, and the second portion covers the first portion. Young's modulus of the second portion is between the 0 MPa and 100 MPa. Young's modulus of the first portion is greater than that of the second portion. The thickness of the first portion is less than that of the second portion.

19 Claims, 6 Drawing Sheets

(58) Field of Classification Search
USPC .................................. 257/790, 703, 758
See application file for complete search history.

(56) References Cited

U.S. PATENT DOCUMENTS

| | | | |
|---|---|---|---|
| 6,866,901 | B2 | 3/2005 | Burrows et al. |
| 6,998,776 | B2 | 2/2006 | Aitken et al. |
| 7,119,409 | B2 | 10/2006 | Kawamura et al. |
| 7,256,543 | B2 | 8/2007 | Su et al. |
| 7,541,671 | B2 | 6/2009 | Foust et al. |
| 7,648,925 | B2 | 1/2010 | Moro et al. |
| 7,652,424 | B2 | 1/2010 | Park et al. |
| 7,728,516 | B2 | 6/2010 | Kawaguchi et al. |
| 8,093,512 | B2 | 1/2012 | Chen et al. |
| 8,253,328 | B2 | 8/2012 | Hayashi |
| 8,264,143 | B2 | 9/2012 | Bae et al. |
| 8,288,944 | B2 | 10/2012 | Lee et al. |
| 8,624,247 | B2 | 1/2014 | Choi |
| 8,742,411 | B2 | 6/2014 | Yoo et al. |
| 8,803,184 | B2 | 8/2014 | Lee et al. |
| 9,142,798 | B2 * | 9/2015 | Chen .................. H01L 51/5256 |
| 9,144,119 | B2 * | 9/2015 | Kim ...................... H01L 51/525 |
| 2003/0064171 | A1 | 4/2003 | Burrows et al. |
| 2004/0079940 | A1 | 4/2004 | Redecker et al. |
| 2004/0197944 | A1 | 10/2004 | Chen et al. |
| 2005/0142382 | A1 | 6/2005 | Menda et al. |
| 2005/0179379 | A1 | 8/2005 | Kim |
| 2005/0184372 | A1 | 8/2005 | Asahi et al. |
| 2005/0238803 | A1 | 10/2005 | Tremel et al. |
| 2005/0249901 | A1 | 11/2005 | Yializis et al. |
| 2005/0287688 | A1 | 12/2005 | Won et al. |
| 2006/0006798 | A1 | 1/2006 | Buckley |
| 2006/0093795 | A1 | 5/2006 | Wang et al. |
| 2006/0113617 | A1 | 6/2006 | Kawamura et al. |
| 2006/0118933 | A1 | 6/2006 | Haba |
| 2006/0139555 | A1 * | 6/2006 | Janssen ............... H01L 51/5246 349/153 |
| 2006/0202613 | A1 | 9/2006 | Kawaguchi et al. |
| 2006/0226523 | A1 | 10/2006 | Foust et al. |
| 2006/0278965 | A1 | 12/2006 | Foust et al. |
| 2007/0152956 | A1 | 7/2007 | Danner et al. |
| 2007/0172971 | A1 | 7/2007 | Boroson |
| 2007/0241674 | A1 * | 10/2007 | Chao .................. H01L 51/5237 313/506 |
| 2008/0006819 | A1 | 1/2008 | McCormick et al. |
| 2008/0012477 | A1 | 1/2008 | Koo et al. |
| 2008/0135998 | A1 | 6/2008 | Witvrouw et al. |
| 2008/0284331 | A1 | 11/2008 | Hayashi |
| 2009/0001877 | A1 | 1/2009 | Park et al. |
| 2010/0019654 | A1 | 1/2010 | Hayashi |
| 2011/0101564 | A1 | 5/2011 | Keenihan et al. |
| 2011/0132449 | A1 * | 6/2011 | Ramadas ............... H05B 33/04 136/256 |
| 2011/0140599 | A1 | 6/2011 | Lee et al. |
| 2011/0272827 | A1 * | 11/2011 | Blizzard ..................... C09J 4/00 257/788 |
| 2011/0303943 | A1 | 12/2011 | Lee et al. |
| 2012/0193544 | A1 * | 8/2012 | Kaneko ................. G01T 1/2018 250/369 |
| 2013/0240848 | A1 | 9/2013 | Lin |
| 2014/0118638 | A1 * | 5/2014 | Chen ..................... G02B 1/105 349/12 |
| 2014/0217621 | A1 * | 8/2014 | Yoo ............................ B32B 3/04 257/788 |
| 2014/0228640 | A1 * | 8/2014 | Breslauer ............... A61M 16/04 600/115 |
| 2014/0305900 | A1 * | 10/2014 | Rogers ............... H05K 13/0023 216/13 |
| 2014/0318707 | A1 * | 10/2014 | Cho ........................... B32B 3/04 156/311 |
| 2014/0319999 | A1 * | 10/2014 | Cho ........................... B32B 3/04 313/504 |
| 2015/0163866 | A1 * | 6/2015 | Chan ...................... H05B 33/04 313/512 |
| 2015/0188085 | A1 * | 7/2015 | Yoo ........................... B32B 3/04 257/790 |
| 2016/0345456 | A1 * | 11/2016 | Chen .................. H01L 51/5246 |

FOREIGN PATENT DOCUMENTS

| | | |
|---|---|---|
| CN | 1894790 | 1/2007 |
| CN | 101308864 | 11/2008 |
| CN | 102183858 | 9/2011 |
| CN | 103325953 | 9/2013 |
| CN | 103779389 | 5/2014 |
| CN | 103887449 | 6/2014 |
| CN | 103998239 | 8/2014 |
| TW | 570472 | 1/2004 |
| TW | 200525002 | 8/2005 |
| TW | 200603416 | 1/2006 |
| TW | I272865 | 2/2007 |
| TW | 200913765 | 3/2009 |
| TW | I314025 | 8/2009 |
| TW | 201012648 | 4/2010 |
| TW | I421607 | 1/2014 |
| TW | 201411906 | 3/2014 |
| TW | I430885 | 3/2014 |
| TW | I434250 | 4/2014 |
| TW | 201417224 | 5/2014 |
| TW | I437526 | 5/2014 |
| TW | 201438316 | 10/2014 |
| WO | 2009036272 | 3/2009 |
| WO | 2011086500 | 7/2011 |

OTHER PUBLICATIONS

Schmidt et al., "Adhesion and Barrier Performance of Novel Barrier Adhesives Used in Multilayered High-Barrier Laminates," Journal of Adhesion Science and Technology, May 2012, 2405-2436.

Chu et akl., "Analysis of Failure Modes of Multilayer Thin Film Encapsulation of OLED Devices and Ca Films," IDW 04 The 11th International Display Workshops, Dec. 2004, pp. 1427-1428.

Kwong et al., "Current status of electrophosphorescent device stability," Organic Electronics, Sep. 2003, pp. 155-164.

Kim et al., "Effects of argon and oxygen flow rate on water vapor barrier properties of silicon oxide coatings deposited on polyethylene terephthalate by plasma enhanced chemical vapor deposition," Thin Solid Films, Jul. 2009, pp. 1929-1934.

Dennler et al., "A new encapsulation solution for flexible organic solar cells," Thin Solid Films, Jan. 2006, pp. 349-353.

Walker et al., "2006 OLEDs World Summit: a personal view," Veritas et Visus Flexible Substrate, Jan. 2007, pp. 39-46.

Kim et al., "High-quality thin-film passivation by catalyzer-enhanced chemical vapor deposition for organic light-emitting diodes," Applied Physics Letters, Jan. 2007, pp. 013502.

Lewis et al., "Thin-Film Permeation-Barrier Technology for Flexible Organic Light-Emitting Devices," IEEE Journal of Selected Topics in Quantum Electronics, Jan. 2004, pp. 45-57.

Huang et al, "Low temperature PECVD SiNx films applied in OLED packaging," Materials Science and Engineering 898, Apr. 2003, pp. 248-254.

Weaver et al., "Organic light-emitting devices with extended operating lifetimes on plastic substrates," Applied Physics Letters, Oct. 2002, pp. 2929-2931.

Peter van de Weijer et al., "White paper on the characterisation of thin-film barrier layers for protection of organic Light-Emitting Diodes", ICT-216641 Fast2light, Sep. 2009, pp. 1-17.

Park et al., "Thin film encapsulation for flexible AM-OLED: a review," Semiconductor Science and Technology, Feb. 2011, pp. 1-9.

Burrows et al., "Ultra barrier flexible substrates for flat panel displays," Display, May 2001, pp. 65-69.

Febreguette et al., "Ultrahigh x-ray reflectivity from W/Al2O3 multilayers fabricated using atomic layer deposition," Applied Physics Letters, Jan. 2006, pp. 013116.

(56) References Cited

OTHER PUBLICATIONS

"Office Action of Taiwan Counterpart Application", dated May 17, 2016, p. 1-p. 9, in which the listed references were cited.
"Office Action of China Counterpart Application", dated Apr. 6, 2017, p. 1-p. 7, in which the listed references were cited.

* cited by examiner

PACKAGE OF FLEXIBLE ENVIRONMENTAL SENSITIVE ELECTRONIC DEVICE AND SEALING MEMBER

CROSS-REFERENCE TO RELATED APPLICATION

This application claims the priority benefits of U.S. provisional application Ser. No. 62/106,234, filed on Jan. 22, 2015, Taiwan application serial no. 104115559, filed on May 15, 2015 and China application serial no. 201510489470.3, filed on Aug. 11, 2015. The entirety of each of the above-mentioned patent applications is hereby incorporated by reference herein.

TECHNICAL FIELD

The disclosure relates to a flexible environmental sensitive electronic device package.

BACKGROUND

As the component design of electronic products become increasingly precise, the requirements for the moisture/oxygen barrier capability are increasing, too. For example, the an organic electroluminescent element is highly sensitive to moisture/oxygen, therefore the organic electroluminescent element is always encapsulated by the thin film encapsulation (TFE), the sealing adhesive, the gas barrier film and the cover board in the current packaging technology to ensure that the organic electroluminescent element is less susceptible to the penetrating of moisture and oxygen thereby affecting the properties of the organic electroluminescent element by the moisture and the oxygen. The sealing adhesive can be a thermal curing adhesive. The thermal curing adhesive has preferable gas barrier properties. However, if the thermal curing adhesive is applied to the package of a flexible organic electroluminescent element, the stress generated by the thermal curing adhesive will cause the packaged organic electroluminescent element be damaged when the packaged organic electroluminescent element is removed from the rigid substrate. In addition, the poor flexural property of the thermal curing adhesive is not suitable to the flection requirement of the flexible organic electroluminescent element.

How to balance the flexural properties, the gas barrier properties and the convenience of the process at the time of packaging a flexible organic electroluminescent element is one of the priorities to be developed.

SUMMARY

A flexible environmental sensitive electronic device package includes a flexible electronic device, a thin film encapsulation (TFE) and a sealing member is provided in one embodiment of the disclosure. The TFE covers the flexible electronic device as well as the sealing member covers the TFE and the flexible electronic device. The sealing member includes a first portion and a second portion, wherein the first portion covers the flexible electronic device and the TFE, and the second portion covers the first portion. Young's modulus of the second portion is between 0 MPa and 100 MPa. Young's modulus of the first portion is greater than that of the second portion. A thickness of the first portion is less than that of the second portion.

The foregoing will become better understood from a careful reading of a detailed description provided herein below with appropriate reference to the accompanying drawings.

DESCRIPTION OF THE EMBODIMENTS

Figure 1A:
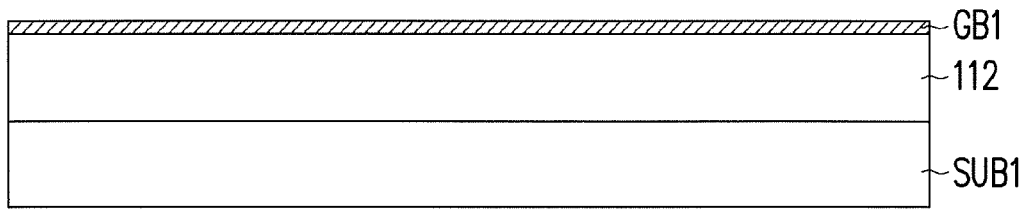
FIG. 1A to FIG. 1G illustrate a manufacturing process of a flexible environmental sensitive electronic device package according to a first embodiment of the disclosure.
Figure 1B:
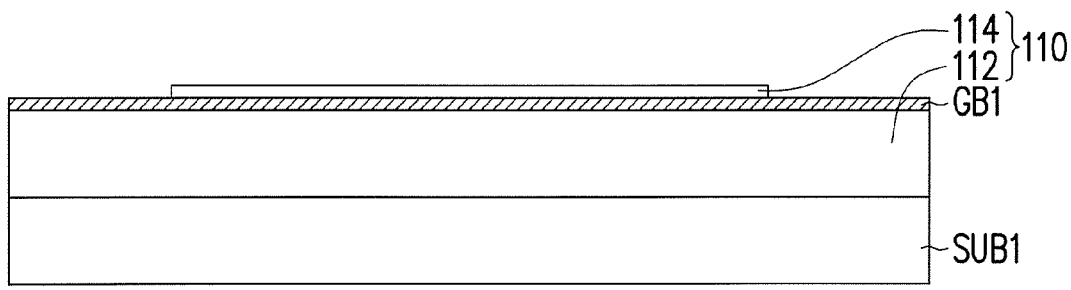

Below, exemplary embodiments will be described in detail with reference to accompanying drawings so as to be easily realized by a person having ordinary knowledge in the art. The inventive concept may be embodied in various forms without being limited to the exemplary embodiments set forth herein. Descriptions of well-known parts are omitted for clarity, and like reference numerals refer to like elements throughout.

FIG. 1A to FIG. 1G illustrate a manufacturing process of a flexible environmental sensitive electronic device package according to a first embodiment of the disclosure. Please refer to FIG. 1A and FIG. 1B, a flexible electronic device 110 is formed on a rigid substrate SUB1. In this embodiment, the rigid substrate SUB1 is a glass substrate or other substrate having a good mechanical strength, for example. The flexible electronic device 110 includes a flexible substrate 112 and an environmental sensitive electronic device 114. The environmental sensitive electronic device 114 is disposed on the flexible substrate 112. The material of the flexible substrate 112 includes glass, metal foil, plastic material or polymer material. The material of the flexible substrate 112 is polyimide (PI), complex of polyimide and inorganic material (hybrid PI), Polyethylene terephthalate (PET), Polyethersulfone (PES), polyacrylate (PA), Polyethylene naphthalate (PEN), polycarbonate (PC), polynorbornene (PNB), polyetherimide (PEI), polyetheretherketone (PEEK), Cyclo olefin polymer (COP), PMMA, Glass Fiber Reinforced Plastic (GFRP) or Carbon Fiber Reinforced Polymer (CFRP), for example. The disclosure is not limited thereto. For instance, the environmental sensitive electronic device 114 is an organic electroluminescence device or other device sensitive to moisture and oxygen. The organic electroluminescence device may be an organic electroluminescence display or an organic electroluminescence light source. In the present embodiment, the organic electroluminescence device may be embodied in various forms without limitations on the device type.

In the present embodiment, a first barrier layer GB1 is disposed on the flexible substrate 112 optionally before the forming of the environmental sensitive electronic device 114, for increasing the moisture/oxygen barrier property of the flexible substrate 112. At this time, portion of the first barrier layer GB1 is distributed between the environmental sensitive electronic device 114 and the flexible substrate 112. The first barrier layer GB1 may be a single film or a multi-layer structure formed by alternately stacking films, and there is no limitation on the number of layers or the material constituting of the first barrier layer GB1 in present embodiment. Based on the aforementioned, when the first barrier layer GB1 is a multi-layer structure formed by alternately stacking films, the first barrier layer GB1, for instance, is a multi-layer structure formed by alternately stacking organic and inorganic films. The first barrier layer BG1 may also be a multi-layer structure formed by alternately stacking inorganic films. When the first barrier layer GB1 is a multi-layer structure formed by alternately stacking inorganic films, the first barrier layer GB1 have good gas barrier properties and is relatively easy to be manufactured. The first barrier layer GB1 is, for instance, a multi-layer structure formed by alternately stacking silicon nitride and silicon oxide films. The Water Vapor Transmission Rate (WVTR) of the first barrier layer GB1 is not greater than $10^{-2}$ g/m$^2$ per Day, preferably not greater than $10^{-6}$ g/m$^2$ per Day.

Figure 1C:
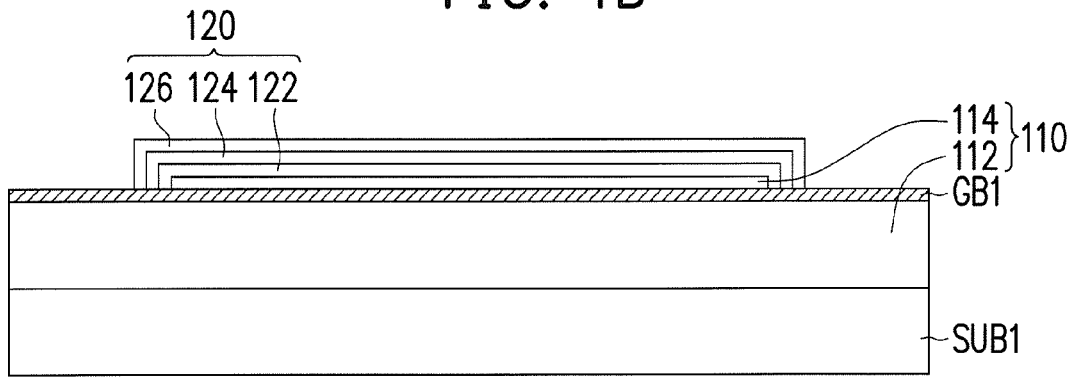

Please refer to FIG. 1C, after the completion of the production of the environmental sensitive electronic device 114, a thin film encapsulation 120 is formed on the flexible substrate 112 to cover the environmental sensitive electronic device 114. In this embodiment, the thin film encapsulation 120 includes a plurality of inorganic films 122, 124, 126 stacking alternately. The aforementioned inorganic films 122, 124, 126 include silicon nitride and silicon oxycarbide (SiOC) films stacking alternately. In the present embodiment, there is no limitation on the number of layers or the material constituting of the inorganic films 122, 124, 126. In other embodiments, the thin film encapsulation 120 includes a single film or a multi-layer film of an organic or inorganic film, or combinations thereof. The inorganic material includes, for instance, $Al_2O_3$, $SiO_x$, $SiN_x$, $SiO_xN_y$, or SiOC. The organic material includes parylene or acrylic. It can be appropriately changed according to the actual design requirement by those skilled in the art.

To avoid absorbing the stress between the environmental sensitive electronic device 114 and the thin film encapsulation 120 of the flexible electronic device 110, a barrier layer (not shown) is formed between the environmental sensitive electronic device 114 and the thin film encapsulation 120 optionally to increase the reliability of the flexible electronic device 110. The material of the buffer layer may be selected from the materials easy to be delaminated under stress, which may release the stress between the environmental sensitive electronic device 114 and the thin film encapsulation 120. The buffer layer is made of small organic molecular compounds, organic oligomers, organic-inorganic metal co-steaming materials or inorganic metal oxides, for example. The molecular weight of the small molecular compounds approximately ranges from 10 g/mol to 2,000 g/mol. The small molecular compounds include, for example, tris-(8-hydroxyquinoline)-aluminum (Alq3), N, N'-di(naphthalene-1-yl)-N, N'-diphenyl-benzidine NPB), or Phthalocyanine copper complex (CuPc). The molecular weight of the oligomers approximately ranges from 500 g/mol to 3,000 g/mol. The oligomers include phenylene vinylene oligomers, or fluorine oligomers, for instance. The organic-inorganic metal co-steaming materials may be obtained from co-steaming by the aforementioned organic materials and metals. The molecular weight of the metal or the organic-inorganic co-steaming materials ranges from 3 g/mol to 500 g/mol. In other words, the aforementioned barrier layer not only can release the stress between the environmental sensitive electronic device 114 and the thin film encapsulation 120 appropriately, but also can control the location of the released stress.

Figure 1D:
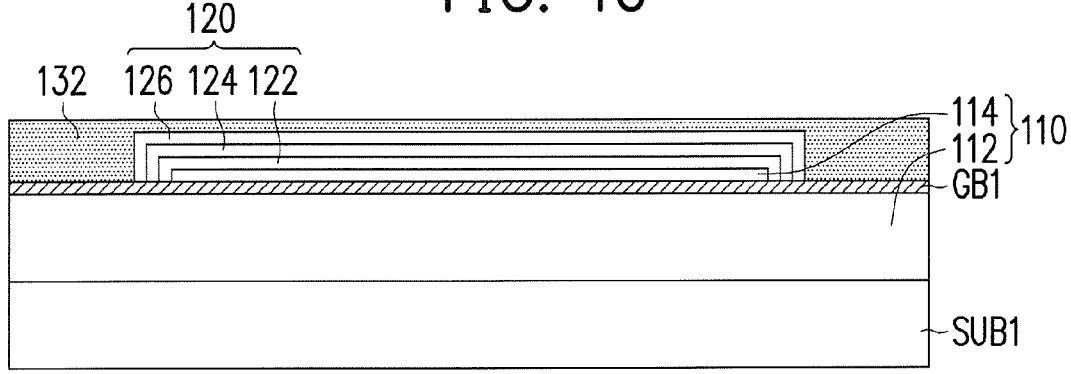
Figure 1E:
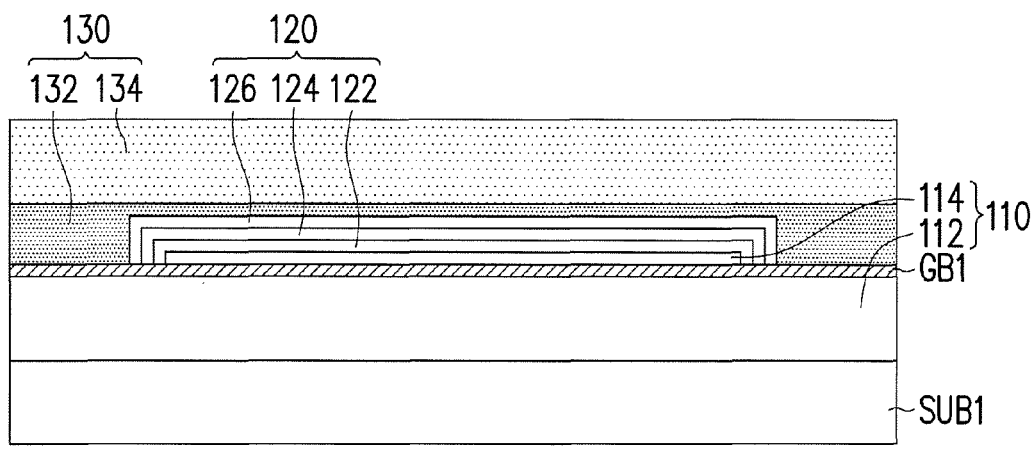
Figure 5A:
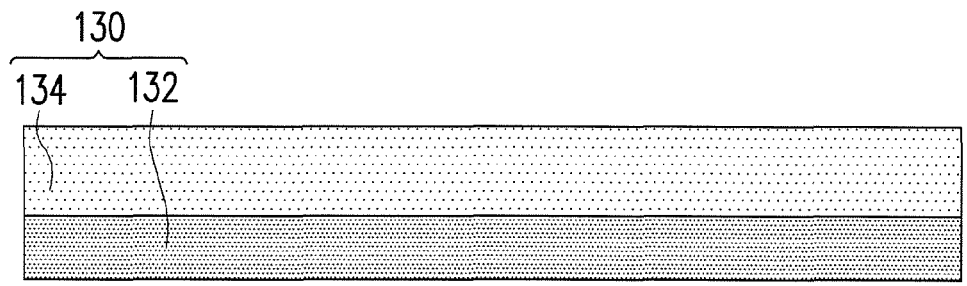
FIG. 5A to FIG. 5E illustrate sectional views of different sealing members, respectively.

Please refer to FIG. 1D and FIG. 1E, after the thin film encapsulation 120 is formed, the sealing member 130 is formed to cover the thin film encapsulation 120 and the flexible electronic device 110. The flexible electronic device 110, the thin film encapsulation 120 and the sealing member 130 preliminarily construct a flexible environmental sensitive electronic device package 100. In this embodiment, the sealing member 130 includes a first portion 132 and a second portion 134, the first portion 132 entirely covers the flexible electronic device 110 and the thin film encapsulation 120. The second portion 134 covers the first portion 132. Young's modulus of the second portion 134 is between 0 MPa and 100 MPa. Young's modulus of the first portion 132 is greater than that of the second portion 134. The thickness of the first portion 132 is less than that of the second portion 134. In this embodiment, Young's modulus of the first portion 132 is between 50 MPa and 1000 MPa. In other embodiment, Young's modulus of the first portion 132 is between 50 MPa and 3000 MPa. The thickness of the first portion 132 is between 1 μm and 10 μm, and the thickness of the second portion 134 is between 5 μm and 25 μm, for instance. The interface of the first portion 132 and the second portion 134 of the sealing member 130 may be clear, or there exists some mixture phenomenon between the first portion 132 and the second portion 134 of the sealing member 130 (no clear interface between the first portion 132 and the second portion 134). In another embodiment, the first portion 132 of the sealing member 130 has a higher proportion of ingredients of high Young's modulus (thermal curing adhesive, for example) and a lower proportion of ingredients of low Young's modulus (pressure sensitive adhesive, for example), the second portion 134 of the sealing member 130 has a lower proportion of ingredients of high Young's modulus (thermal curing adhesive, for example) and a higher proportion of ingredients of low Young's modulus (pressure sensitive adhesive, for example), and the proportion of ingredients of the high Young's modulus material of the sealing member 130 decreases along the thickness direction. In one embodiment, the Young's modulus of the sealing member 130 may be gradually changed along the thickness direction by appropriately controlling the degree of heating or the degree of UV curing of the sealing member 130. The sealing member 130 of this embodiment may be formed integrally in the manufacturing process of the flexible environmental sensitive electronic device package, or may be formed beforehand (as shown in FIG. 5A).

In one embodiment, the first portion 132 of the sealing member 130 is an adhesive satisfied the aforementioned Young's modulus and thickness, for instance, a thermal curing adhesive which the curing temperature is less than or equal to 120 degree Celsius. The second portion 134 of the sealing member 130 is an adhesive satisfied the aforementioned Young's modulus and thickness, for instance, a pressure sensitive adhesive. The first portion 132 (the thermal curing adhesive, for instance) of the sealing member 130 has preferable gas barrier properties, and the second portion 134 (the pressure sensitive adhesive, for instance) of the sealing member 130 has preferable stress buffer capabilities and flexural properties. In other words, the sealing member 130 in this embodiment can give consideration to both the flexural properties and gas barrier properties of the flexible environmental sensitive electronic device package 100. For instance, the material of the first portion 132 of the sealing member 130 includes Epoxy resin, Urea resin, Melamine, or Phenol resin, while the material of the second portion 134 of the sealing member 130 includes acrylics, butyl rubber, ethylene-vinyl acetate, nitriles, silicon rubber, or styrene block copolymer. The environmental sensitive electronic device 114 is, for instance, an active environmental sensitive electronic display device or a passive environmental sensitive electronic display device. Here, the active environmental sensitive electronic display device is, for example, an active matrix organic light emitting diode (AM-OLED), an active matrix electrophoretic display (AM-EPD), the so-called electronic paper, or an active matrix liquid crystal display (AM-LCD). The passive environmental sensitive electronic display device is, for example, a passive matrix organic light emitting diode (PM-OLED) or a super-twisted nematic liquid crystal display (STN-LCD).

In this embodiment, when the flexible environmental sensitive electronic device package 100 is separated from the rigid substrate SUB1, the less the thickness of the first portion 132 is, the less the stress (normal stress and shear stress) between the thin film encapsulation 120 and the environmental sensitive electronic device 114 and the stress (normal stress and shear stress) between the thin film encapsulation 120 and the first portion 132 are. The greater the thickness of the second portion 134 is, the less the stress (normal stress and shear stress) between the thin film encapsulation 120 and the environmental sensitive electronic device 114 and the stress (normal stress and shear stress) between the thin film encapsulation 120 and the first portion 132 are. In addition, the less the Young's modulus of the first portion 132 and the second portion 134 are, the less the stress (normal stress and shear stress) between the thin film encapsulation 120 and the flexible electronic device 110 and the stress (normal stress and shear stress) between the thin film encapsulation 120 and the first portion 132 are.

When the outmost layer of the thin film encapsulation 120 is a silicon nitride film 126, the structure of silicon nitride film 126 is easy to become loose under a high temperature and then a penetration path for moisture and oxygen is formed. At this time, the first portion 132 (the thermal curing adhesive, for instance) contacts with the silicon nitride film 126 directly can improve the phenomenon of loose structure of the silicon nitride film 126, and to ensure that the penetration path for moisture and oxygen is not formed easily. The gas barrier properties of the thin film encapsulation 120 and the sealing member 130 can be ensured.

Figure 1F:
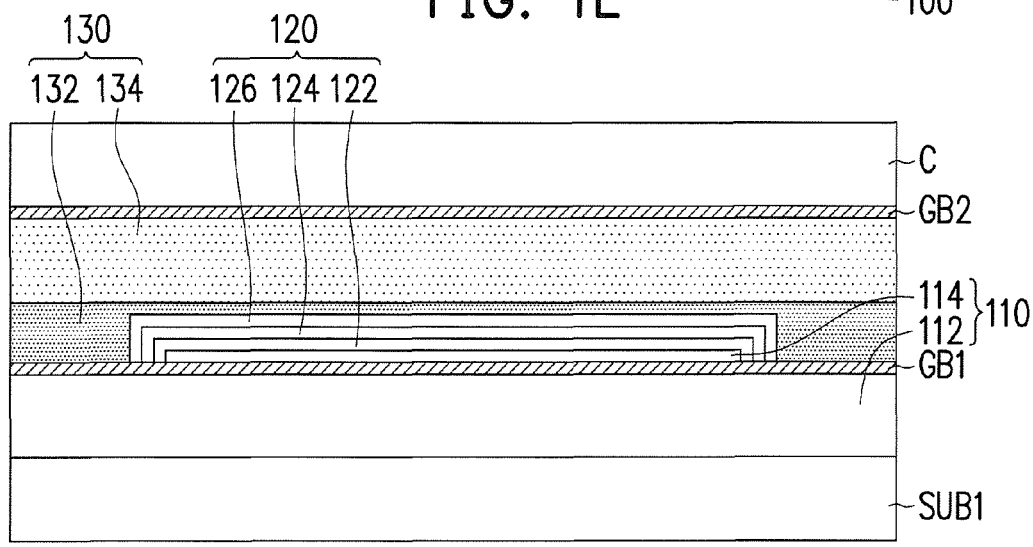

Please refer to FIG. 1F. In this embodiment, for increasing the gas barrier properties of the flexible environmental sensitive electronic device package 100 including the flexible electronic device 110, the thin film encapsulation 120 and the sealing member 130, a second barrier layer GB2 and a flexible cover C may be formed optionally on the sealing member 130 (that is, the second portion 134) to make the sealing member 130 be disposed between the flexible electronic device 110 and the flexible cover C. In other words, the sealing member 130 is also disposed between the thin film encapsulation 120 and the flexible cover C. In one embodiment, the second barrier layer GB2 and the first barrier layer GB1 may be made of the same material, while the flexible cover C and the flexible substrate 112 may be made of the same material.

Figure 1G:
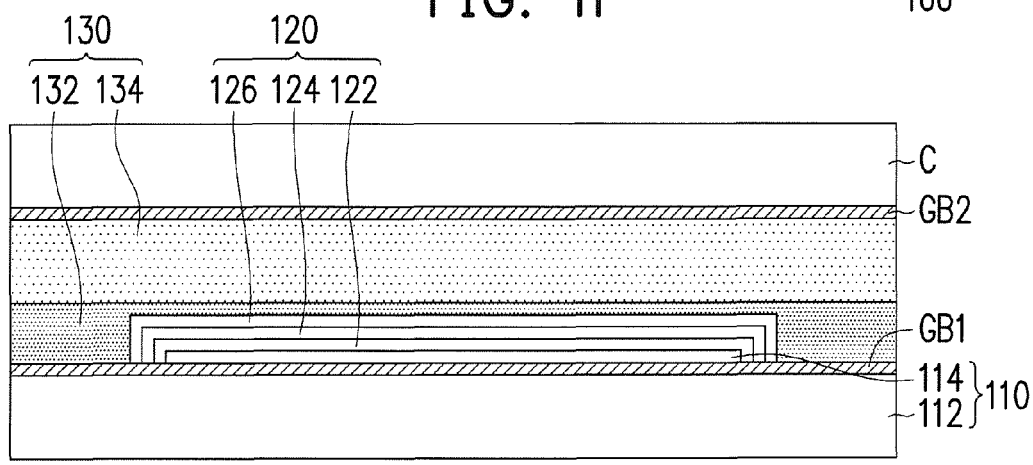

Please refer to FIG. 1G. After forming the sealing member 130, the second barrier layer GB2 and the flexible cover C, the flexible environmental sensitive electronic device package 100 is removed from the rigid substrate SUB1. In the removing process of the flexible environmental sensitive electronic device package 100, the sealing member 130 includes the first portion 132 with preferable gas barrier properties and the second portion 134 with preferable flexural properties, therefore, the sealing member 130 have good gas barrier properties, and the flexible environmental sensitive electronic device package 100 also may be removed from the rigid substrate SUB1 at a room temperature in this embodiment. The yield of the manufacturing process is also improved.

According to simulation results, when the flexible environmental sensitive electronic device package 100 is removed from the rigid substrate SUB1 at the room temperature, the normal stress and the shear stress between the interface of the environmental sensitive electronic device 114 and the thin film encapsulation 120 is greater if the sealing member is made of the thermal curing adhesive. When the flexible environmental sensitive electronic device package 100 is removed from the rigid substrate SUB1 at the room temperature, the normal stress and the shear stress between the interface of the environmental sensitive electronic device 114 and the thin film encapsulation 120 is less if the sealing member is made of the pressure sensitive adhesive. When the flexible environmental sensitive electronic device package 100 is removed from the rigid substrate SUB1 at the room temperature, the normal stress and the shear stress between the interface of the environmental sensitive electronic device 114 and the sealing member 130 is between the aforementioned two cases if the sealing member is made as aforementioned in this embodiment (for example, the hybrid of thermal curing adhesive and the pressure sensitive adhesive).

Figure 2A:
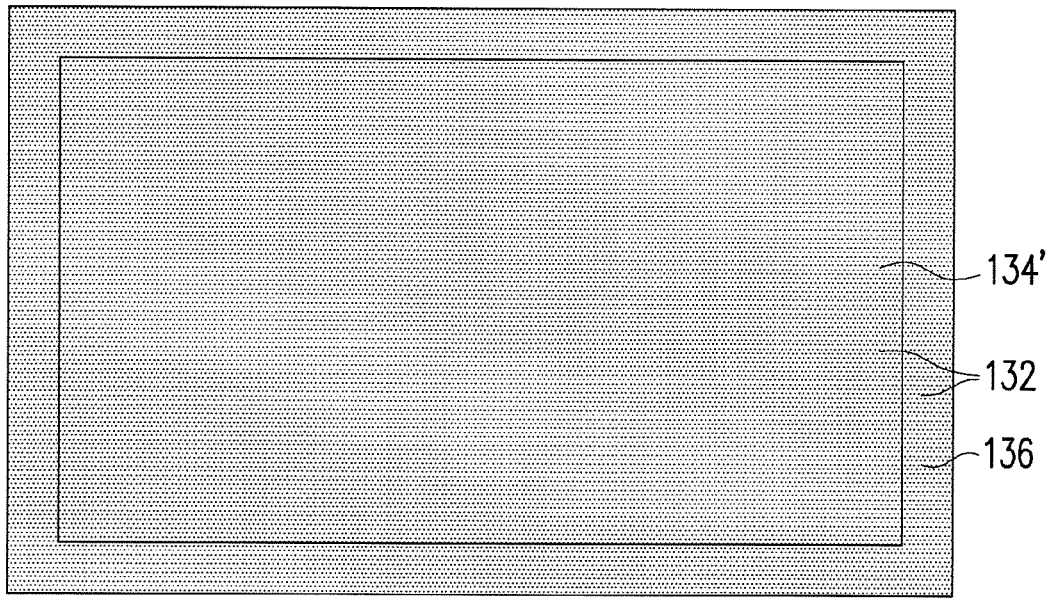
FIG. 2A and FIG. 2B illustrate a top view and a sectional view of a flexible environmental sensitive electronic device package, respectively, according to a second embodiment of the disclosure.
Figure 2B:
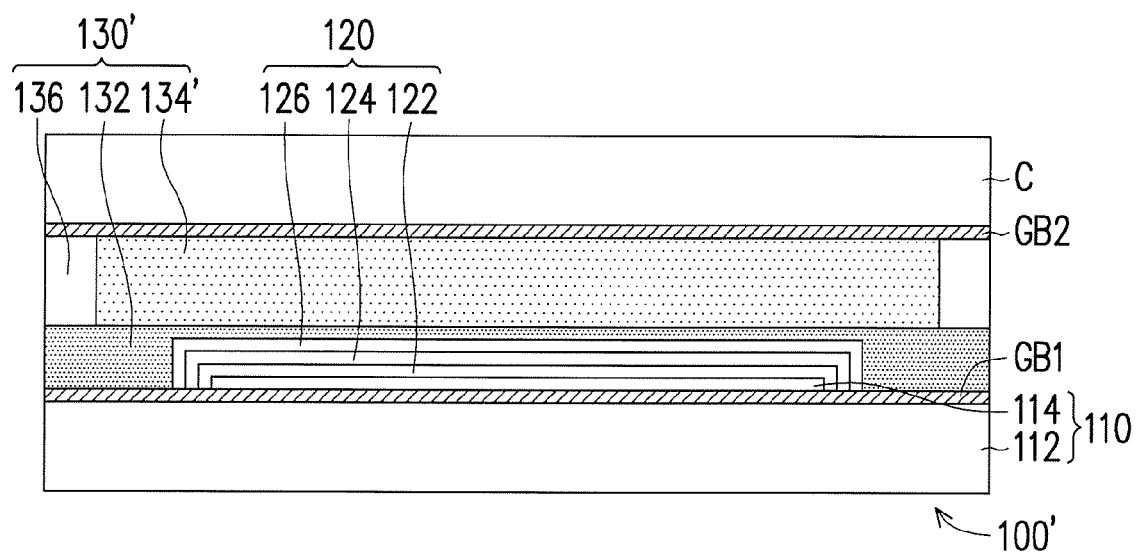
Figure 5B:
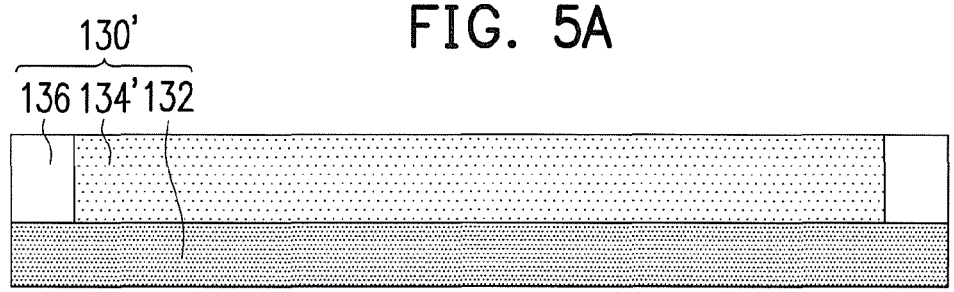

FIG. 2A and FIG. 2B illustrate a top view and a sectional view of a flexible environmental sensitive electronic device package, respectively, according to a second embodiment of the disclosure. Please Refer to FIG. 2A and FIG. 2B. In the second embodiment, the flexible environmental sensitive electronic device package 100' is similar to the flexible environmental sensitive electronic device package 100 in the first embodiment. The difference between the two is that the first portion 132 of the sealing member 130' is a thermal curing adhesive, for instance, and the second portion 134' is a fluid, for instance. For example, the fluid is a high surface tension fluid, a high viscosity fluid, or a fluid with low moisture absorbent (for example, silicon oil). In addition, in the second embodiment, the sealing member 130' of the flexible environmental sensitive electronic device package 100' may further include a side wall barrier structure 136. The side wall barrier structure 136 is disposed on the first portion 132 and is embedded in the second portion 134'. Except with the good gas barrier properties, the side wall barrier structure 136 also can limit the flow range of the second portion 134' (fluid). The sealing member 130' of the second embodiment may be formed integrally in the manufacturing process of the flexible environmental sensitive electronic device package, or may be formed beforehand (as shown in FIG. 5B).

Figure 3A:
FIG. 3A and FIG. 3B illustrate a top view and a sectional view of a flexible environmental sensitive electronic device package, respectively, according to a third embodiment of the disclosure.
Figure 3B:
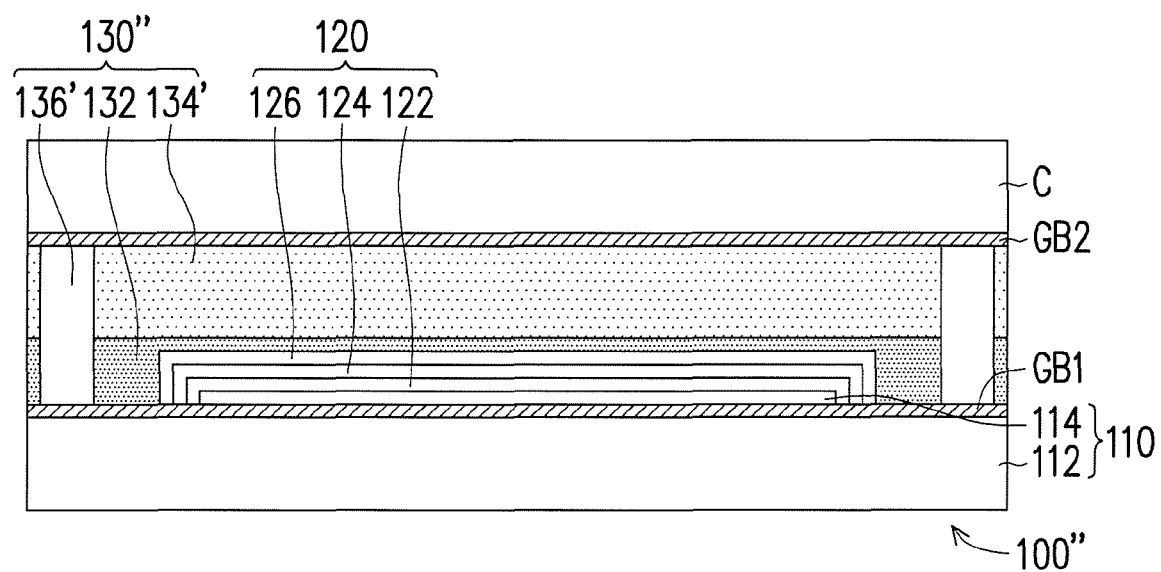

FIG. 3A and FIG. 3B illustrate a top view and a sectional view of a flexible environmental sensitive electronic device package, respectively, according to a third embodiment of the disclosure. Please refer to FIG. 3A and FIG. 3B. In the third embodiment, the flexible environmental sensitive electronic device package 100" is similar to the flexible environmental sensitive electronic device package 100' in the second embodiment. The difference between the two is that the side wall barrier structure 136' of the flexible environmental sensitive electronic device package 100" embedded in both the first portion 132 and the second portion 134' of the sealing member 130". The second portion 134' mentioned in the third embodiment is not necessary to be a fluid, and the second portion 134' may be a non-fluid.

Figure 5C:
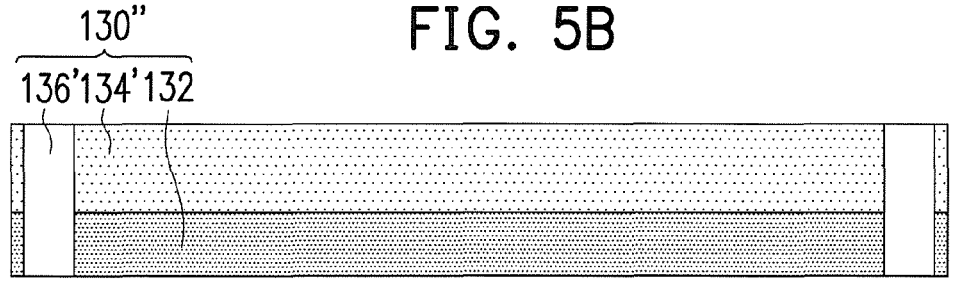

The sealing member 130" of this embodiment may be formed integrally in the manufacturing process of the flexible environmental sensitive electronic device package, or may be formed beforehand (as shown in FIG. 5C).

Figure 4A:
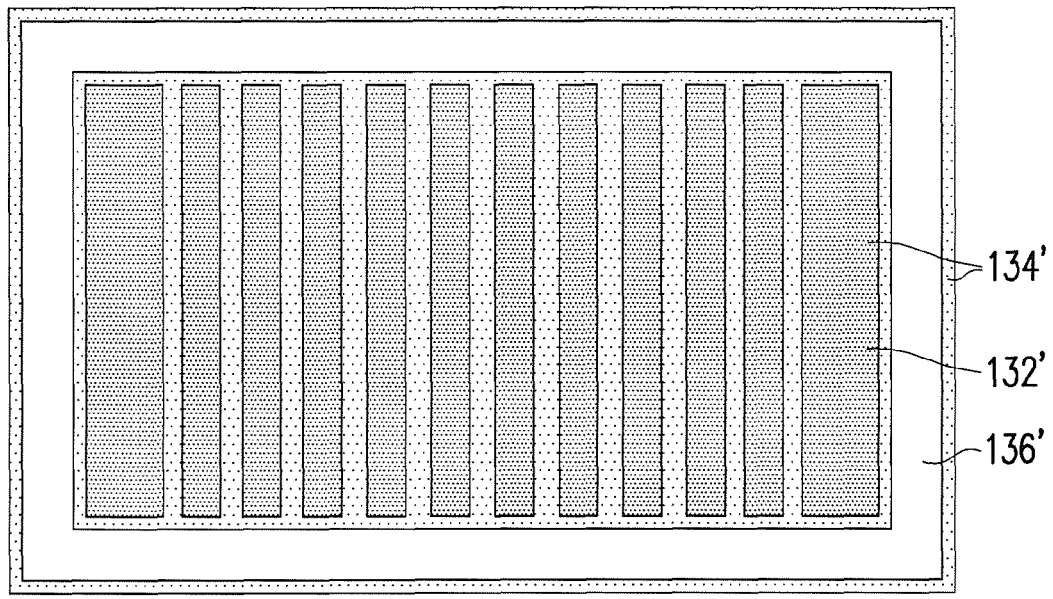
FIG. 4A and FIG. 4B illustrate top views and a sectional view of a flexible environmental sensitive electronic device package, respectively, according to a forth embodiment of the disclosure.
Figure 4B:
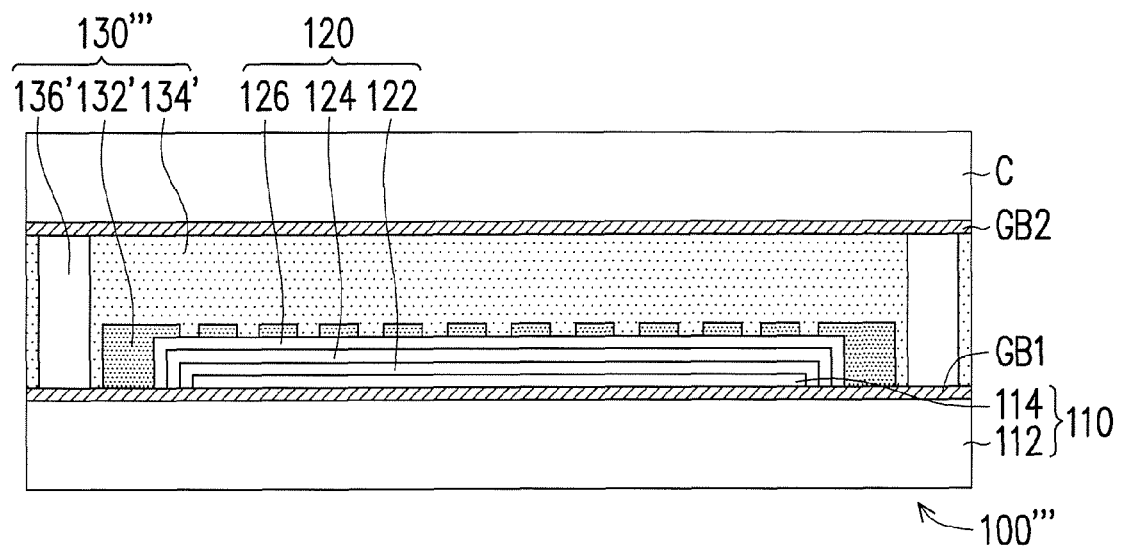
Figure 5D:
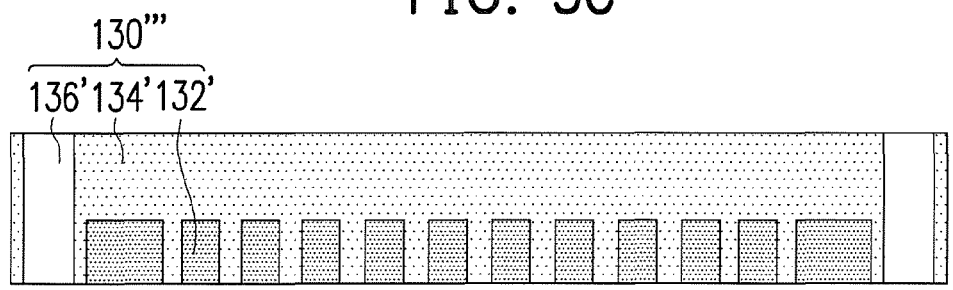
Figure 5E:
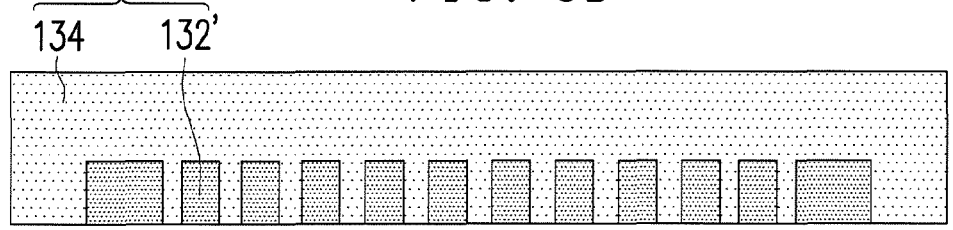

FIG. 4A and FIG. 4B illustrate a top view and a sectional view of a flexible environmental sensitive electronic device package respectively according to a forth embodiment of the disclosure. Please refer to FIGS. 4A and 4B. In the fourth embodiment, the flexible environmental sensitive electronic device package 100''' is similar to the flexible environmental sensitive electronic device package 100'' in the third embodiment. The difference between the two is that the sealing member 130''' has a different structure in the fourth embodiment. In the fourth embodiment, the first portion 132' of the sealing member 130''' includes a plurality of separated patterns (as shown in the left side of FIG. 4A) or a continuous pattern with a hollow region (as shown in the right side of FIG. 4A) to partially cover the thin film encapsulation 120. The patterns can be strip or lump patterns, for instance. In addition, the first portion 132' is covered by the second portion 134', and the first portion 132' does not extend to a side of the flexible environmental sensitive electronic device package 100'''. The sealing member 130''' of the fourth embodiment may be formed integrally in the manufacturing process of the flexible environmental sensitive electronic device package, or may be formed beforehand (as shown in FIG. 5D). Except the sealing member 130, 130', 130", 130''' as shown in FIG. 5A (the first embodiment) to FIG. 5D (the forth embodiment), the fourth embodiment also can utilize the sealing member 130a as shown in FIG. 5E.

The first portion 132 (thermal curing adhesive, for example) includes a plurality of separated patterns and there is a space between every two of the plurality of separated patterns, therefore the flexible environmental sensitive electronic device package 100''' may be de-bonded from the rigid substrate at a room temperature. The first portion 132 of the sealing member 130''' is patterned, therefore this facilitates to increase the flexural properties of the flexible environmental sensitive electronic device package 100'.

According to the aforementioned embodiments, the sealing member is made of a plurality of different sealing materials with different Young's modulus, therefore both the flexural properties and the gas barrier properties of the flexible environmental sensitive electronic device package can be taken into consideration. In addition, the flexible environmental sensitive electronic device package can be de-bonded from the rigid substrate SUB1 at the room temperature. The time and the cost of the manufacturing process of the flexible environmental sensitive electronic device package can be reduced.

It will be apparent to those skilled in the art that various modifications and variations can be made to the present disclosure. It is intended that the specification and examples be considered as exemplary embodiments only, with a scope of the disclosure being indicated by the following claims and their equivalents.

What is claimed is:

1. A flexible environmental sensitive electronic device package, comprising:
    a flexible electronic device;
    a thin film encapsulation, covering the flexible electronic device; and
    a sealing member, covering the flexible electronic device and the thin film encapsulation, wherein the sealing member includes a first portion and a second portion, the first portion covers the flexible electronic device and the thin film encapsulation, the second portion covers the first portion, Young's modulus of the second portion is between 0 MPa and 100 MPa, Young's modulus of the first portion is greater than that of the second portion, a thickness of the first portion is less than that of the second portion, and the first portion includes a plurality of separated patterns or a continuous pattern with a hollow region to partially cover the thin film encapsulation.

2. The flexible environmental sensitive electronic device package according to claim 1, wherein the flexible electronic device includes:
    a flexible substrate;
    an environmental sensitive electronic device disposed on the flexible substrate; and
    a first barrier layer disposed on the flexible substrate, wherein a portion of the first barrier layer is distributed between the environmental sensitive electronic device and the flexible substrate.

3. The flexible environmental sensitive electronic device package according to claim 2, wherein the thin film encapsulation includes a plurality of inorganic films and the plurality of inorganic films cover the environmental sensitive electronic device.

4. The flexible environmental sensitive electronic device package according to claim 3, wherein an outmost layer of the thin film encapsulation is a silicon nitride film and the thin film encapsulation contacts the first portion of the sealing member directly.

5. The flexible environmental sensitive electronic device package according to claim 1, wherein the first portion of the sealing member includes a thermal curing adhesive and the second portion of the sealing member includes a pressure sensitive adhesive.

6. The flexible environmental sensitive electronic device package according to claim 1, wherein the first portion of the sealing portion includes a thermal curing adhesive and the second portion of the sealing member includes a fluid.

7. The flexible environmental sensitive electronic device package according to claim 1, wherein the sealing member further includes a side wall barrier structure disposed on the first portion.

8. The flexible environmental sensitive electronic device package according to claim 1, wherein the thickness of the first portion is between 1 μm and 10 μm and the thickness of the second portion is between 5 μm and 25 μm.

9. The flexible environmental sensitive electronic device package according to claim 1, wherein the first portion entirely covers the thin film encapsulation.

10. The flexible environmental sensitive electronic device package according to claim 1, further including:
    a barrier layer disposed between the flexible electronic device and the thin film encapsulation.

11. The flexible environmental sensitive electronic device package according to claim 1, further including:
    a flexible cover, covering the sealing member, wherein the sealing member is disposed between the flexible electronic device and the flexible cover; and
    a second barrier layer, disposed between the flexible cover and the sealing.

12. The flexible environmental sensitive electronic device package according to claim 1, wherein Young's modulus of the first portion is between 50 MPa and 3000 MPa.

13. A sealing member, adapted to cover a flexible electronic device, the sealing member comprising:
a first portion and a second portion, wherein the first portion covers the flexible electronic device, the second portion covers the first portion, Young's modulus of the second portion is between 0 MPa and 100 MPa, Young's modulus of the first portion is greater than that of the second portion, a thickness of the first portion is less than that of the second portion, and the first portion includes a plurality of separated patterns or a continuous pattern with a hollow region.

14. The sealing member according to claim 13, wherein the first portion of the sealing portion includes a thermal curing adhesive and the second portion of the sealing member includes a pressure sensitive adhesive.

15. The sealing member according to claim 13, wherein the first portion of the sealing portion includes a thermal curing adhesive and the second portion of the sealing member includes a fluid.

16. The sealing member according to claim 13, wherein the thickness of the first portion is between 1 μm and 10 μm and the thickness of the second portion is between 5 μm and 25 μm.

17. The sealing member according to claim 13, further including a side wall barrier structure surrounding the second portion.

18. The sealing member according to claim 13, wherein Young's modulus of the first portion is between 50 MPa and 3000 MPa.

19. A flexible environmental sensitive electronic device package, comprising:
a flexible electronic device, comprising:
a flexible substrate; and
an environmental sensitive electronic device disposed on the flexible substrate;
a thin film encapsulation, covering the flexible electronic device, wherein the thin film encapsulation comprises a plurality of inorganic films and the plurality of inorganic films cover the environmental sensitive electronic device; and
a sealing member, covering the flexible electronic device and the thin film encapsulation, wherein the sealing member includes a first portion and a second portion, the first portion covers the flexible electronic device and the thin film encapsulation, the second portion covers the first portion, Young's modulus of the second portion is between 0 MPa and 100 MPa, Young's modulus of the first portion is greater than that of the second portion, and a thickness of the first portion is less than that of the second portion.

* * * * *